United States Patent [19]
Macheel

[11] 3,936,759
[45] Feb. 3, 1976

[54] OFFSET REDUCTION APPARATUS FOR ANALOG CIRCUITS

[75] Inventor: Gary W. Macheel, Anaheim, Calif.

[73] Assignee: The United States of America as represented by the Secretary of the Air Force, Washington, D.C.

[22] Filed: Apr. 17, 1974

[21] Appl. No.: 461,671

[52] U.S. Cl. ............................ 328/162; 307/229
[51] Int. Cl.² ........................................ H04B 15/00
[58] Field of Search ........ 328/162, 163, 165; 330/9, 330/51, 35, 149; 307/237, 229; 178/7.3 DC, 7.5 DC

[56] References Cited
UNITED STATES PATENTS

| | | |
|---|---|---|
| 3,263,177 | 7/1966 | Durrett .............................. 330/9 |
| 3,649,924 | 3/1972 | Lucas ................................ 330/9 |
| 3,654,560 | 4/1972 | Cath et al. ..................... 328/162 X |
| 3,667,055 | 5/1972 | Uchida ............................ 330/9 X |
| 3,810,031 | 5/1974 | Poujois .......................... 330/35 X |

Primary Examiner—John Zazworsky
Attorney, Agent, or Firm—Joseph E. Rusz; William Stepanishen

[57] ABSTRACT

An offset reduction apparatus for an analog circuit in which the analog signal input to the loop is forced to zero and the loop output is determined. The previously determined value of the offsets is subtracted from the total output, thus leaving only the desired signal.

8 Claims, 3 Drawing Figures

OFFSET REDUCTION APPARATUS FOR ANALOG CIRCUITS

BACKGROUND OF THE INVENTION

The present invention relates broadly to an analog circuit apparatus and in particular to an offset reduction apparatus for eliminating DC offsets in an output signal.

In many prior art circuits, such as analog/digital converters, an analog input signal level is established and then processed through various gains, switches or stages to produce a resultant analog output signal or error signal. In the most common application of the analog/digital converter, the converter is used to transform information into a form suitable for processing on a digital computer. This requires that analog information must be quantized into discrete voltage signals having an assigned logical 0 or 1 level (for example, ground or +5 volts). The raw information frequently is taken from measurements of temperatures, forces, shaft rotations, or other continuous quantities and is first represented by an analog electrical signal, which is then converted to digital. The effect of this processing is often sufficiently different from the ideal effect — due to dc offsets caused by switches, amplifier offsets, etc. — to introduce significant errors. In many cases where the output or error signal is not required continuously, these undesirable effects may be greatly reduced, often to a substantially negligible amount, by the present invention which is described herein.

SUMMARY

The present invention utilizes an operational amplifier to remove DC offsets which have accumulated on an analog input signal during circuit processing. The offset reduction apparatus determines the DC offset which is present in circuit and substracts the DC offset from the total circuit output to provide an analog output signal.

It is one object of the invention, therefore, to provide an improved offset reduction apparatus to determine the DC offset present in an output analog signal.

It is another object of the invention to provide an improved offset reduction apparatus for removing the DC offset present in an output analog signal.

These and other advantages, objects and features and objects of the invention will become more apparent from the following description taken in connection with the illustrative embodiment in the accompanying drawings.

DESCRIPTION OF THE PREFERRED EMBODIMENT

Figure 1:
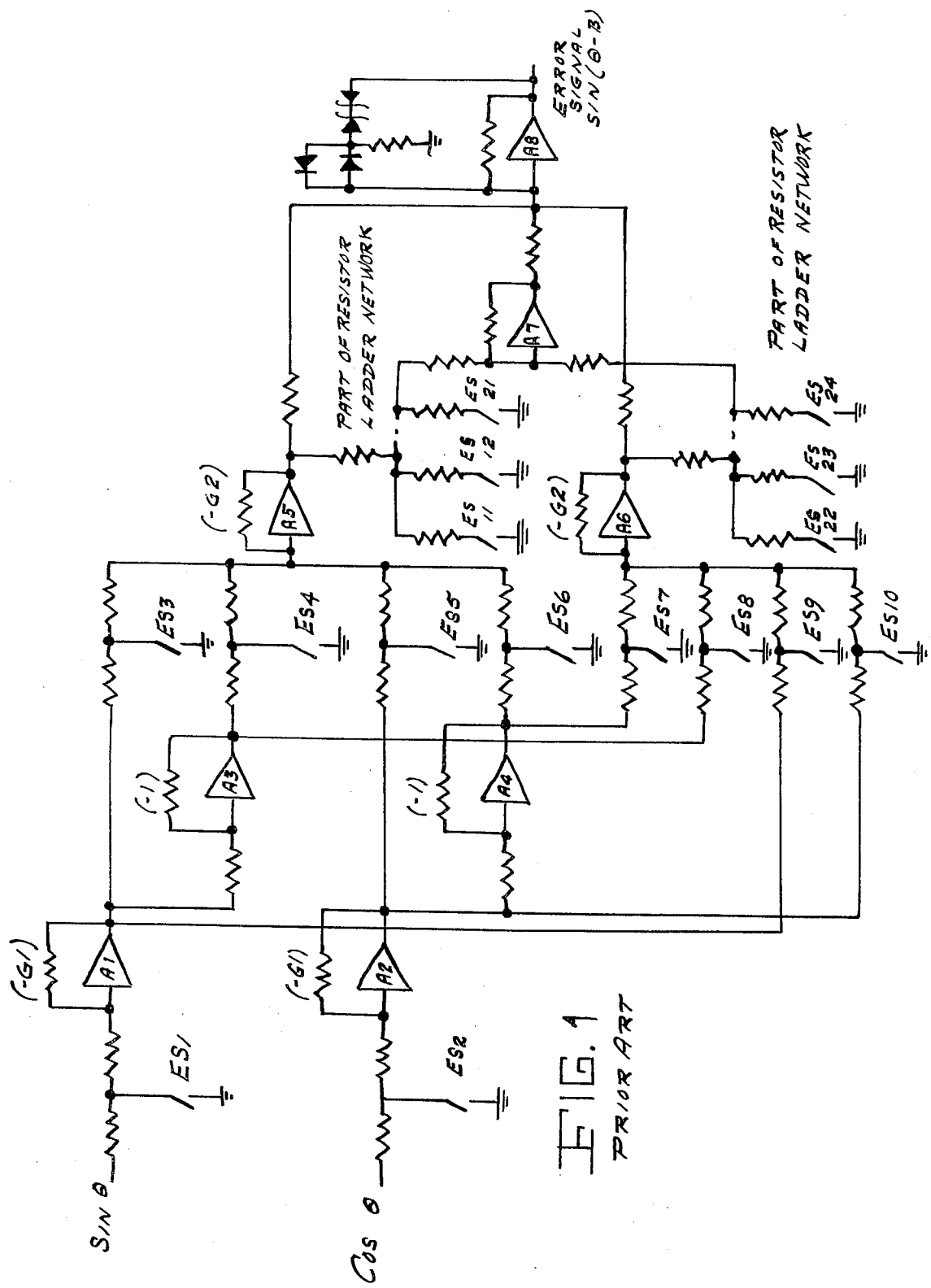
FIG. 1 is a schematic diagram of a prior art analog/digital converter.

Turning now to FIG. 1, there is shown a schematic diagram of a prior art analog/digital converter. By way of example, the present invention will be described in this specification with respect to its use in an analog/digital converter. However, the concept has a much broader scope than this particular application alone and there is not intention to limit the scope of the invention by the present example. The A/D converter accepts two analog input signals (sin $\theta$, Cos $\theta$), where $\theta$ is the angle of the input resolver, and converts this analog ratio of Sin $\theta$ and Cos $\theta$ to digital information representing the angle $\theta$. This may be accomplished by implementing the trigonometric identity:

$$\text{Sin } \theta \text{ Cos } B - \text{Cos } \theta \text{ Sin } B = \text{Sin } (\theta - B) \quad (\text{Eq.1})$$

where $B$ represents the binary coded angle which is considered to be the output of the unit and Sin $(\theta - B)$ is equal to zero, when $\theta = B$. The quantity Sin $(\theta - B)$ can therefore be considered as the error signal which indicates by its sign whether $\theta$ is greater or less than $B$. The multipliers, Sin B and Cos B are achieved by a specially designed resistor network (in FIG. 1 shown as a resistor ladder network) operating as a voltage divider. Since the resistor network (Sin B, Cos B, multiplier) can not change the sign from quadrant to quadrant as B varies, a system of amplifiers and switches operating on the input Sin $\theta$ and Cos $\theta$ is used to change these signs as required. The electronic switches ES3 through ES10 are operated such that the outputs of the two amplifiers A1, A2 are some consistent pattern, such as that shown in Table 1 below for each quadrant, as determined by the binary angle B (e.g. in quadrant 3, (180° ≤ B <270°) the output of A5 is —Sin $\theta$ and that of A6 is Cos $\theta$).

TABLE I

| Quadrant | A5 Output | A6 Output |
|---|---|---|
| 1 | Sin $\theta$ | —Cos $\theta$ |
| 2 | —Cos $\theta$ | —Sin $\theta$ |
| 3 | —Sin $\theta$ | Cos $\theta$ |
| 4 | Cos $\theta$ | Sin $\theta$ |

These signals are then applied to the resistor multiplier network (FIG. 1 resistor ladder network) and the error signal Sin $(\theta - B)$ becomes the output of amplifier A8. The states of switches ES11 through ES32 are determined by the binary state of the output register (B angle). The switches ES11 and ES22 are in complement state as are all corresponding binary bits of the network.

In order to determine the error signal at the output of amplifier A8, the Sin $\theta$ and Cos $\theta$ inputs into amplifiers A1 and A2, respectively, are both forced to zero with ES1 and ES2 open. Ideally, the error signal will be zero as shown from equation 1. However, it will be some value which is dependent upon the values of the offsets of the amplifiers A1–8 and the electronic switches. This value of offset will, further, vary as the states of the resistor network switches and the quadrant of B vary. The true error signal will, with normal Sin $\theta$ and Cos $\theta$ inputs, be in error by this offset level.

Figure 2:
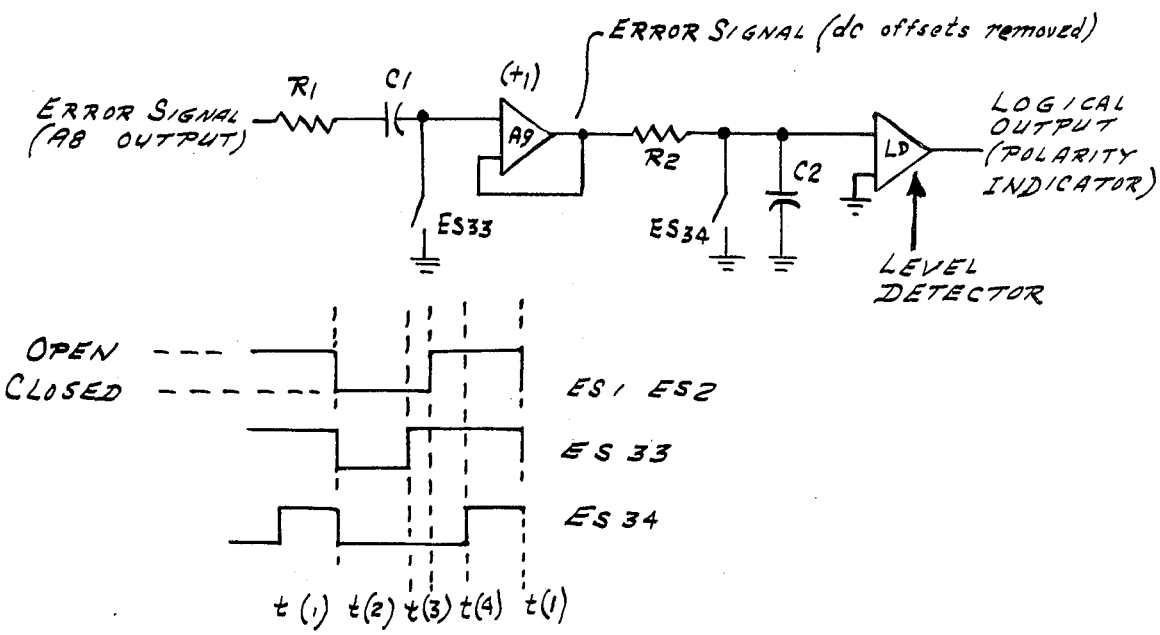
FIG. 2 is a schematic diagram of the offset reduction apparatus in accordance with the present invention, and, FIG. 3 is a schematic diagram of the offset reduction apparatus with a compensation circuit added.

Referring now to FIG. 2, there is shown an offset reduction apparatus which will remove the offset level from the error signal at amplifier, A8, FIG. 1. It may be seen from the timing diagram of FIG. 2 that switches ES1, ES2, ES33 and ES34 are closed at time, T1. This results in the Sin $\theta$ and Cos $\theta$ inputs being forced to a near zero level and the error signal (A8 output) will go to some offset level as previously discussed. After a transient switching period, the error signal output (A8) reaches a steady state level. Since switch ES33 is closed, the current flows through capacitor C1 and C1 is eventually charged to the level of the A8 output. Meanwhile, capacitor C2 is discharged to ground through switch ES34. At time T2 switch ES33 is opened. It is important that this occurs sometime before the T3 time when the input levels are again applied. This is necessary to insure that switch ES33 is indeed completely "open" to prevent a further change in the dc level across capacitor C1. Amplifier A9 is designed to maximize input impedance and minimize bias current requirements such that the effect of the current flow through capacitor C1 will be negligible during the time switch ES33 is open. At T3 time, the input is again allowed to pass by switches ES1 and ES2 and the amplifier A8 output assumes a steady level which will be made up of the active error signal plus the dc offsets. Some time after T3 (depending upon the speed of the loop) the output of amplifier A9 will be at the true level of the error signal without the dc offsets that were still present in amplifier A8 output since the dc offset voltage has been stored on capacitor C1 and is subtracted from the total signal leaving only the corrected error signal. Amplifier A9 is chosen to have a low offset voltage, since the output of amplifier 9 will be in error by this offset level.

The circuitry following amplifier A9 is used as a filter to provide noise rejection. At time T(4), after switching transients have settled switch ES34 is opened and current will flow through resistor R2 and capacitor C2 in an effort to establish the voltage of amplifier A9 out across capacitor C2. The resistor capacitor R2C2 product is chosen such that the charging time of capacitor C2 is long with respect to spurious noise spikes on the error signal, but of the same order of magnitude as the time from T4 to the next T1. This will allow the voltage across capacitor C2 to reach a sufficient level to clearly define the output of the level detector, LD. This output becomes a polarity indication of the error signal, and is consequently used to control the setting of the binary B register by providing information as to whether the present value of B is greater or less than the desired value ($\theta$). At each time T1, the output of level detector LD is read and the state of the B register changed accordingly. At this time, any other necessary changes in ES switches are made and the process begins again. Amplifier A9 is a conventional differential operational amplifier which is commercially available under either part number 2620 or 2500 from Harris/Intertype Corp. Melbourne, Calif. The level detector LD, is also a conventional device which is commercially available under the part number LM111 from National Semi-conductor Corp, 2900 Semi-conductor Drive, Santa Clara, Calif.

Figure 3:
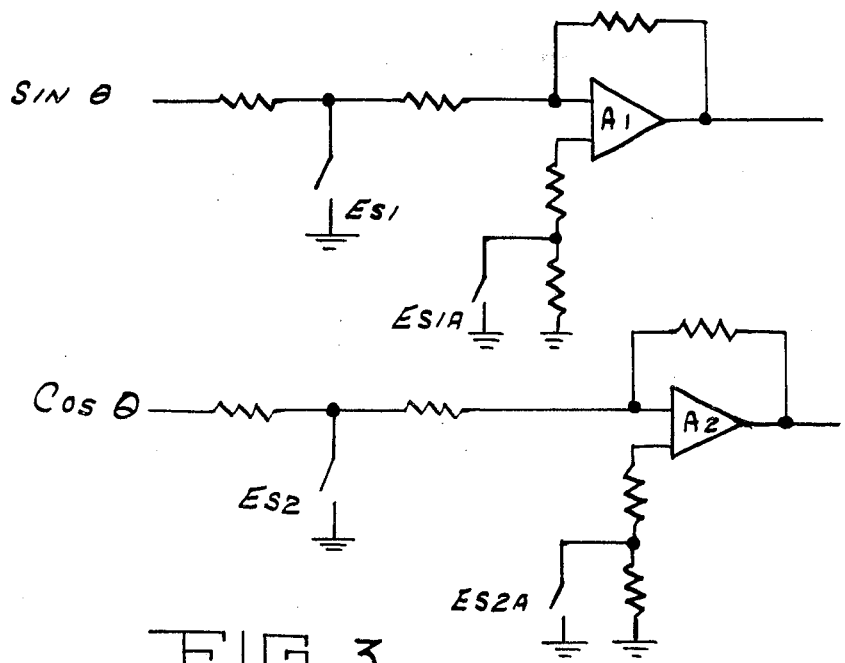

There is shown in FIG. 3 the input amplifier A1 and A2 of FIG. 1 with their respective input circuitry. Since switches ES1 and ES2 may have voltage offsets which may introduce changes in the current offset of amplifier A1 or A2 of FIG. 1 when they are switches, a compensating circuit is added to amplifier A1 and A2 to minimize these effects. The amplifiers A1 and A2 of FIG. 1 which are shown in FIG. 3 are differential operational amplifiers having a compensation network respectively connected between their negative input terminals and ground. The compensation network comprises two resistors in series to ground with a switch connected from the junction of the two resistors to ground. These switches ES1A,2A would be driven by the same logic signal as ES1 and ES2. The effect of this compensation circuit is to maintain a constant dc output from amplifiers A1 and A2 during either the open or the closed state of ES1 and ES2.

Although the invention has been described with reference to a particular embodiment, it will be understood to those skilled in the art that the invention is capable of a variety of alternative embodiments within the spirit and scope of the appended claims.

What is claimed is:

1. An offset reduction apparatus for analog circuits comprising in combination:

means for forcing the input of an analog circuit to zero, the output of said analog circuit being the DC offset of said analog circuit, said analog circuit receiving input signals, said analog circuit having a negative input terminal, said analog circuit providing an error signal in response to said input signals, said error signal being an output signal and said DC offset, and means for storing and subtracting said DC offset connected to said output of said analog circuit, said storing and substracting means storing said DC offset from said analog circuit, said storing and substracting means substracting said DC offset from said error signal, a compensation network connected between said negative input terminal and ground, said compensation network providing a constant DC output from said analog circuit during normal and correction circuit operation, said compensation network comprising a pair of resistors connected in series and a switch connected from the junction of said resistors to ground.

2. An offset reduction apparatus as described in claim 1 wherein said forcing means comprises a switch circuit connected between said analog circuit input and ground, said switch circuit being open during normal analog circuit operation, said switch circuit being switched to ground to force said analog circuit input to zero.

3. An offset reduction apparatus as described in claim 1 wherein said means for storing and subtracting comprises a resistor and a capacitor in series, said output of said analog circuit being connected to said resistor, said capacitor receiving said DC offset from said analog circuit through said resistor, and a switch connected from said capacitor to ground, said capacitor storing said DC offset when said switch is closed to ground, said capacitor substracting said DC offset from said error signal when said switch is opened.

4. An offset reduction apparatus as described in claim 1 wherein further including input impedance means to maximize input impedance and minimize bias currents, said input impedance means being connected to said storing and substracting means, said input impedance means having a bias current flow through said storing and substrating means, said bias current flow having a negligible effect upon the current flow in said storing means during operation.

5. An offset reduction apparatus as described in claim 4 wherein said input impedance means comprises an operational amplifier having a first and second input terminal and an output terminal, said first input terminal being connected to said storing and subtracting means, said second input terminal being directly connected to said output terminal.

6. An offset reduction apparatus as described in claim 5 further including filter means to provide noise rejection.

7. An offset reduction apparatus as described in claim 6 further including a level detector to clearly define said output signal from said analog circuit.

8. An offset reduction apparatus as described in claim 7 wherein said level detector comprises an operational amplifier with a first and second input terminal, said first input terminal receives said output signal, said second input terminal being connected to ground.

* * * * *